United States Patent [19]
Campbell et al.

[11] 4,323,911
[45] * Apr. 6, 1982

[54] DEMULTIPLEXING PHOTODETECTORS

[75] Inventors: Joe C. Campbell, Middletown; Tien P. Lee, Holmdel, both of N.J.

[73] Assignee: Bell Telephone Laboratories, Incorporated, Murray Hill, N.J.

[ * ] Notice: The portion of the term of this patent subsequent to Jul. 15, 1997, has been disclaimed.

[21] Appl. No.: 127,942

[22] Filed: Mar. 7, 1980

Related U.S. Application Data

[63] Continuation of Ser. No. 969,346, Dec. 14, 1978, Pat. No. 4,213,138.

[51] Int. Cl.³ .................. H01L 27/14; H01L 29/161
[52] U.S. Cl. ........................... 357/30; 357/16; 357/17
[58] Field of Search .................. 357/30, 16, 17

[56] References Cited

U.S. PATENT DOCUMENTS

| | | | |
|---|---|---|---|
| 2,949,498 | 8/1960 | Jackson | 136/89 |
| 3,537,029 | 10/1970 | Krersel | 331/94.51 |
| 3,752,713 | 8/1975 | Sokuta | 148/171 |
| 3,821,777 | 6/1974 | James | 357/39 |
| 3,881,513 | 4/1975 | Rideout | 250/551 |
| 3,891,993 | 6/1975 | Beneking | 357/19 |
| 3,982,261 | 9/1976 | Antypas | 357/16 |
| 3,993,964 | 11/1976 | Yonezu | 331/94.5 H |
| 4,045,749 | 8/1977 | Bronham | 331/94.5 H |
| 4,047,123 | 9/1977 | Kirby | 331/94.5 H |

Primary Examiner—Martin H. Edlow
Attorney, Agent, or Firm—Daniel D. Dubosky

[57] ABSTRACT

A 3-terminal totally integrated demultiplexing photodiode is disclosed wherein information present simultaneously at two wavelengths can be developed into two separate currents available at the three terminals. Two quaternary n-type layers (103 and 105) of indium gallium arsenide phosphide having unequal bandgaps and each having a pn junction are separated by a layer (104) of n-type indium phosphide. The device is oriented so as to present the incoming radiation first to the quaternary layer having the larger bandgap and then to the quaternary layer having the lower bandgap. One of the contacts (111) is attached to the top layer (106) of n-type indium phosphide, a second contact (112) is attached to a central p-type region (110) established in the top layer of indium phosphide and penetrating through the top quaternary layer, and the third contact (113 or 302) is connected either to the indium phosphide substrate (101) or to a p-type outer region (301) that surrounds all of the layers. By reversing the dc potential applied to the junctions in the quaternary layers, a dual-wavelength light emitting diode is provided.

4 Claims, 5 Drawing Figures

DEMULTIPLEXING PHOTODETECTORS

CROSS-REFERENCE TO RELATED APPLICATION

This application is a continuation of our copending application, Ser. No. 969,346, filed Dec. 14, 1978.

BACKGROUND OF THE INVENTION

This invention relates to multiwavelength devices and, more particularly, to devices that are capable of detecting or generating more than one optical wavelength.

In order to expand the transmission capabilities of optical fiber systems, it will be desirable to transmit and receive more than one wavelength on a single optical fiber. To accomplish this, several prior art proposals have used classical optical components such as lenses, prisms, gratings, or interference filters. These prior art systems all suffer from the necessity of using multiple components, each one of which must be capable of passing the wavelength of interest and coupling this wavelength to an ultimate photodetector or optical source. It would be highly desirable if the detection and demultiplexing or generation and multiplexing of multiple wavelengths could take place in a single integrated device.

The problem of detecting several wavelengths in a single incoming wave has been solved using several photodetectors in the solar energy art, see for example, U.S. Pat. No. 2,949,498 to E. D. Jackson, issued Aug. 16, 1960. This apparatus by Jackson uses several semiconductor elements that are connected in series from an electrical standpoint, and the incoming radiation is coupled to the first element in a tandem arrangement of elements with the element having the largest bandgap being placed first in the series of elements. As a result, the first element detects the optical energy from the incoming radiation with photons having energy equal to or greater than the bandgap of the material in this first element. The following elements in the series extract other energy from the incoming optical wave whose photons have energy equal to or greater than their respective bandgaps.

This approach of using individual semiconductor devices has been followed in the copending application entitled "Optical Monitoring Photodetector System", by R. C. Miller and B. Schwartz, filed June 19, 1978, Ser. No. 916,501 which application is assigned to the same assignee as the present application. In this Miller et al. application two phtotdetectors are coupled together by an electrically insulating layer 154 in FIG. 3, and the active layers of each photodetector are arranged such that the first active layer to be encountered by radiation incoming and reflected from an optical fiber 108 has the larger bandgap. In the Miller et al. application the layer closest to the optical fiber is used in a feedback circuit to control the laser source in response to light energy reflected from the fiber, and the layer furthest from the optical fiber is used to detect information that is transmitted from a remote source over the optical fiber. This device, however, like the apparatus in the Jackson patent is really two separate photodetectors 150 and 152 that have been sandwiched together for the purpose of providing optical alignment. It would be highly desirable to have a single integrated structure that would provide a device capable of demultiplexing and detecting separate wavelengths present in an optical fiber.

SUMMARY OF THE INVENTION

In accordance with the present invention a multiwavelength semiconductor device is provided by epitaxially growing a semiconductor layer of one conductivity type on a substrate of semiconductor material such as indium phosphide or gallium arsenide. A plurality of semiconductor layers of the opposite conductivity type are epitaxially grown on this bottom layer. A top layer of the first conductivity type is then epitaxially grown as the top-most layer, or at least a portion of the top layer of the opposite conductivity type is converted to one of the first conductivity type by diffusing an appropriate dopant into the top layer. The layer adjacent to the first grown or bottom layer and the layer adjacent to the top layer are caused to be the active layers by creating pn junctions in each of these two layers by diffusing dopants of the first conductivity type into these layers. In addition, the materials of these two active layers are selected such that the layers have unequal bandgaps each one of which is less than the bandgap of the top and bottom layers and all other layers between these two active layers. The two active layers are caused to be separated by at least one barrier layer having a bandgap that is higher than the bandgap for either of the active layers. An electrode configuration is then deposited on the device whereby a dc potential may be independently coupled across the pn junctions in each of the active layers.

When utilized as a multiwavelength photodetector, the device is oriented with respect to incoming radiation so as to cause that radiation to first pass through the active layer having the larger bandgap. As a result, this layer extracts optical energy from the incoming radiation for which the photons have energies equal to or greater than the bandgap of this layer. The remaining radiation at longer wavelengths passes through a barrier layer to the other active layer having the lower bandgap. This lower active layer is sensitive to the photons whose energy is less than the bandgap of the upper active layer, but greater than the bandgap of this lower layer. The barrier layer provides the very important function of electrically isolating the charge carriers created by the incoming photons in each of the active layers.

It is a feature of the present invention that a second barrier layer can be inserted between the two active layers to provide additional optical isolation by selecting the material in this layer to absorb some of the photon energy that should have been detected in the top-most active layer.

By reversing the dc bias potentials that are applied to the pn junctions in the two active layers the present invention can function as a multiwavelength source of radiation. In this context each of the pn junctions is forward biased by the dc potentials in order to generate photons in each of the active layers, whose energies are equivalent to the bandgaps of the material in which they originate.

BRIEF DESCRIPTION OF THE DRAWING

The invention will be more readily understood after reading the following detailed description in conjunction with the drawings wherein.

DETAILED DESCRIPTION

Figure 1:
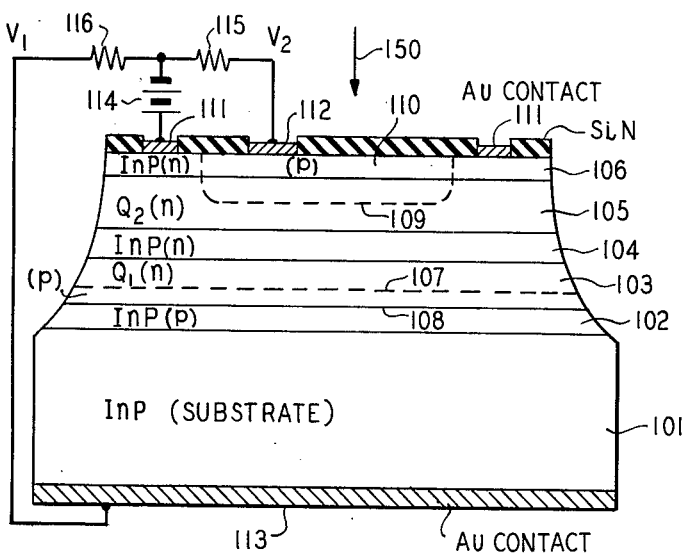
FIG. 1 is a schematic diagram of a dual wavelength photodetector constructed in accordance with the present invention.

The dual wavelength photodetector shown in FIG. 1 is constructed on a <111> oriented indium phosphide substrate 101 by liquid phase epitaxy using a quasi equilibrium solution technique. For further explanation of this technique, see the article entitled "Small-Area High-Radiance C. W. InGaAsP L.E.D.S Emitting at 1.2 to 1.3 μm", by A. G. Dentai, T. P. Lee and C. A. Burrus, *Electronic Letters*, Vol. 13, 1977, pp. 484-485. The first layer grown is a Zn-doped layer 102 of p-type indium phosphide. This is followed in succession by an $In_{0.7}Ga_{0.3}As_{0.66}P_{0.34}$ layer 103 ($Q_1$), a layer 104 of InP and a layer 105 of $In_{0.79}Ga_{0.21}As_{0.46}P_{0.54}$ ($Q_2$). Finally, a layer 106 of InP is grown as a window layer in order to protect the top quaternary layer 105 and to enable a pn junction to be formed within layer 105 that is isolated from the top surface of the device. The last four layers 103–106 are undoped n-type.

After crystal growth the wafer is annealed in a vacuum at 650° C. for 1-hour to drive the zinc from the Zn-doped InP layer 102 into the ($Q_1$) layer 103 thereby forming a pn junction 107 approximately one micrometer from the $Q_1$-InP interface 108. During this drive-in diffusion, the entire surface is protected by a silicon nitride (SiN) film to prevent surface decomposition. A second pn junction 109, about three micrometers deep into the $Q_2$ layer 105 is then formed by diffusing Zn for 35 minutes at 550° C. into a 150 micrometer diameter window region 110 that has been opened in the SiN masking film. As a result of this latter diffusion, the p-type region 110 which creates the junction in $Q_2$ is restricted to only a portion of the top surface thereby permitting electrical contact to be established with the n-side of the pn junctions 107 and 109 by way of a contact ring 111 on the top surface as will be described hereinafter.

Figure 2:
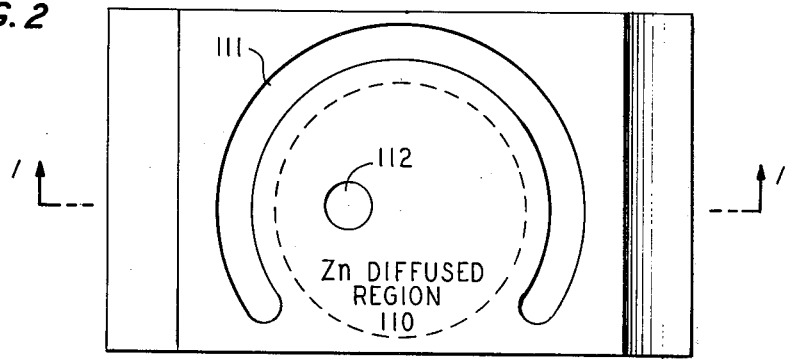
FIG. 2 is a top view of the device illustrated in FIG. 1.

As indicated in FIG. 1 the demultiplexing diode is a 3-terminal device. Two of the terminals, the one making contact to the common n region of junctions 107 and 109 and the other one making contact to the p region 110, are fabricated by pulse electroplating gold simultaneously onto the p region 110 and the n region of the top-most layer 106. Prior to plating these contacts, the entire top surface of the crystal is covered with a layer of SiN. The areas of this layer corresponding to the contacts to be established are then opened by masking with a photoresist and plasma etching the layer of SiN. The areas of the SiN layer that are not etched remain on the top surface so as to provide electrical isolation between the electrical contacts. The contact to the n-region, designated as 111 in FIG. 1, is shaped like a horseshoe as indicated in FIG. 2 and thereby surrounds the Zn diffused region 110. The contact to the p region 110 is a 50 micrometer dot designated as 112 in FIGS. 1 and 2 and located off-center in the diffused region 110. The third and final contact, that to the p side of junction 107, is made by plating gold to the substrate side of the crystal. As indicated by the designated numerals 113 in FIG. 1. Finally, the chips are etched into mesas having diameters of approximately 250 micrometers and each chip is then mounted on a TO-18 header. The mesas are etched in order to reduce the area of $Q_1$ and the concomitant dark current.

Figure 3:
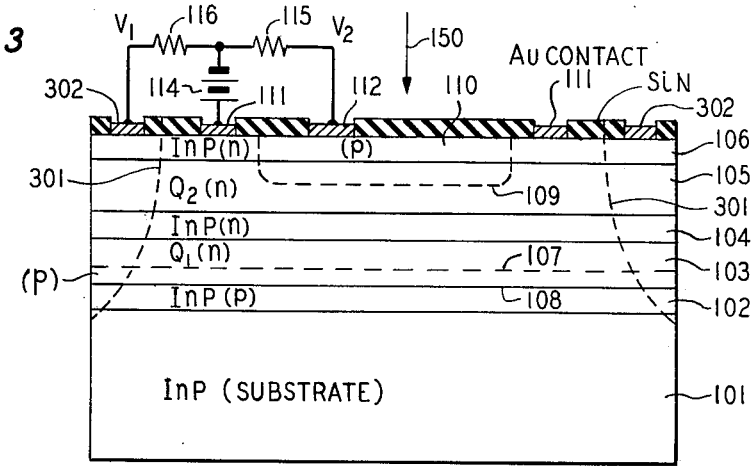
FIG. 3 is a schematic diagram of a planar dual wavelength photodetector constructed in accordance with the present invention.

An alternative device can be manufactured by diffusing Zn into the regions of the crystal that would otherwise be etched in order to form the mesas of the device shown in FIG. 1. As indicated in FIG. 3, this resulting p-type region defined by dotted line 301 surrounds the n-type regions in layers 103 through 106 and makes contact with the p-type regions in layers 102 and 103. As a result, the third contact 113 in FIG. 1 can be replaced by a circular or horseshoe-type contact 302 in FIG. 3. This third contact 302 like contact 113 in FIG. 1 permits electrical contact to be established to the p side of junction 107. As indicated in FIG. 3, the resulting device has the advantage of being a planar demultiplexing photodetector, that is, a device in which all electrical contacts are made to a single plane of the device. In all other respects the device of FIG. 3 is identical to the device of FIG. 1.

To operate the device of FIGS. 1 and 3 as a demultiplexing photodetector, junctions 107 and 109 are reverse biased by a dc potential source 114, whose positive terminal is connected to contact 111 and whose negative terminal is connected through load resistors 115 and 116 to contacts 112 and 113 or 112 and 302. The currents that are developed across junction 109 by virtue of the incoming radiation 150 that has photon energies greater than the bandgap of layer 105 result in the development of a voltage $V_2$ across load resistor 115. That part of the incoming radiation 150 that has photon energies less than the bandgap of layer 105, but greater than the bandgap of layer 103 develop currents across junction 107 that appear as a potential across load resistor 116.

Figure 4:
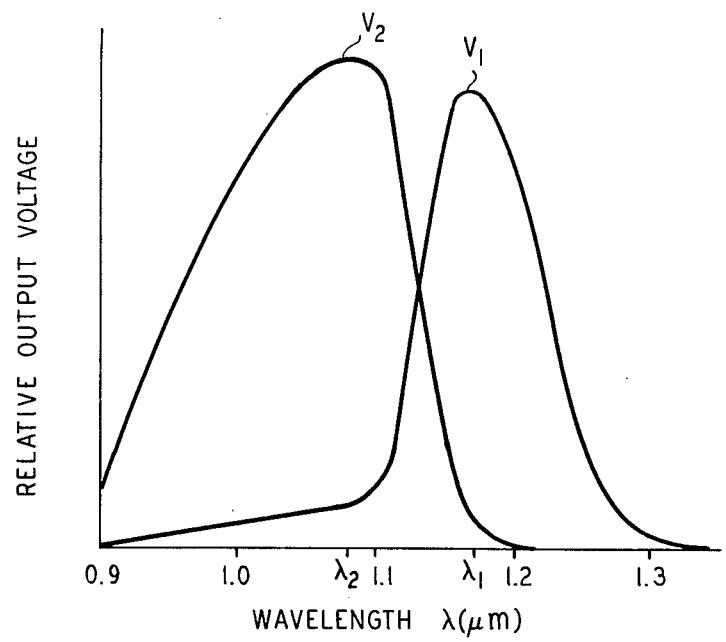
FIGS. 4 and 5 are curves which illustrate the performance of the device shown in FIG. 1.

A light source consisting of a tungsten lamp and a scanning monochromator was used to measure the spectral response of the demultiplexing diode shown in FIG. 1. This source which has a spectral width of approximately 100Å was focused onto the diffused region 110 by using a 20X microscope objective. The photoresponse as a function of wavelength was then measured with phase sensitive detection and plotted on a X-Y recorder. The resulting responsivity curves are shown in FIG. 4. The signals developed across load resistors 116 and 115 by the currents developed in the $Q_1$ and $Q_2$ layers respectively, are labelled as $V_1$ and $V_2$ in FIG. 4. As indicated in FIG. 4, the response peak for $Q_2$ occurs at 1.08 micrometers and has dropped by 3 dB at 1.13 micrometers, whereas the response peak of $Q_1$ occurs at 1.17 micrometers and falls by 3 dB at 1.23 micrometers. The short wavelength cutoff of curve $V_1$ is due to the absorption that takes place in the $Q_2$ layer and the long wavelength cutoff of both curves correspond approximately to the bandgap energies of the layers as determined by photoluminescence.

Figure 5:
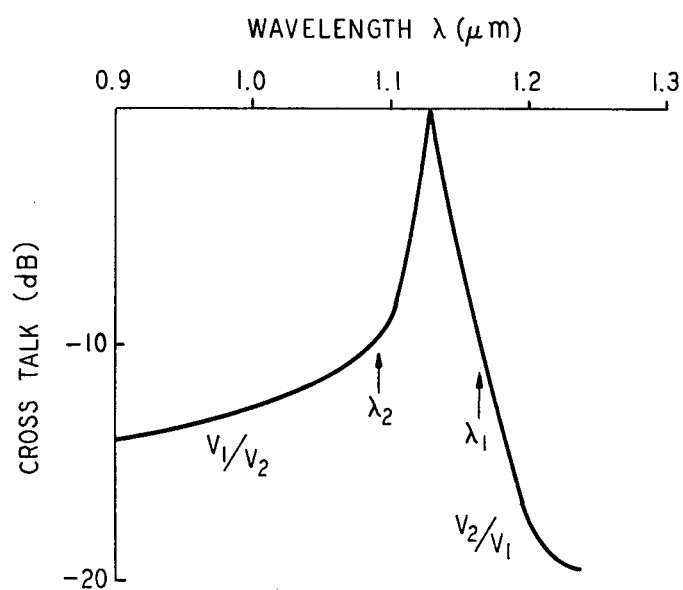

The amount of overlap between the curves in FIG. 4 is a measure of the crosstalk between the two wavelength bands. In this connection FIG. 5 shows a plot of the ratio of the response as a function of wavelength. At the response peaks, designated as $\lambda_1$ and $\lambda_2$ in FIGS. 4 and 5, the crosstalk is less than −10 dB and it improves for wavelengths on opposite sides of the peak. Further reduction of the crosstalk can be achieved by (1) using low doping concentrations in the quaternary layers to lower the electric field in the depletion regions, (2) increasing the thickness of $Q_2$ to insure more complete absorption of the short wavelength photons, (3) adjusting the crystal compositions of the quaternary layers to provide greater wavelength separation between the response curves, and (4) increasing the thickness and doping concentration of the InP barrier layer that separates the quaternary layers to reduce the diffusion of carriers from one quaternary layer to another.

Finally, further reduction of the crosstalk could be achieved in a structure slightly different from that shown in FIGS. 1 and 3. In this alternate structure another layer is grown between layers 104 and 105 in FIG. 1. The composition of this new layer is selected to have a bandgap equivalent to the crossover wavelength between $\lambda_1$ and $\lambda_2$ in FIG. 4. As a result, this additional layer will absorb photons whose energies are less than the bandgap of the $Q_2$ layer but greater than the bandgap of the $Q_1$ layer thereby providing additional isolation between the two quaternary layers.

What has been described hereinabove is merely an illustrative embodiment of the present invention. Numerous departures may be made by those skilled in the art without departing from the spirit and scope of the present invention. In addition to those modifications indicated hereinabove, the entire multiwavelength semiconductor device with photodetectors or light emitting diodes may be constructed by using other materials systems, for example, gallium arsenide may be used in place of the indium phosphide as substrate and the ternary gallium aluminum arsenide may be used in place of quaternary layers $Q_1$ and $Q_2$.

We claim:

1. A demultiplexing photodetector comprising an indium phosphide substrate, a bottom indium phosphide layer of one conductivity type epitaxially grown on said substrate, a plurality of semiconductor layers including a top layer all of the opposite conductivity type epitaxially grown on said bottom layer, and a region of said top semiconductor layer being doped such that said region is of said one conductivity type CHARACTERIZED IN THAT said plurality of semiconductor layers includes a first quaternary layer having a first bandgap and being epitaxially grown on said bottom indium phosphide layer, said first quaternary layer having a diffused pn junction within the layer, at least one barrier layer epitaxially grown on said first quaternary layer, a second quaternary layer having a second bandgap potential and being epitaxially grown on said barrier layer, said second quaternary layer having a diffused pn junction within the layer created by said region of said one conductivity type, said barrier layer having a bandgap higher than either of said quaternary layers, and said photodetector further includes an electrode means for independently coupling potentials to the pn junctions in each of said quaternary layers.

2. A demultiplexing photodetector as defined in claim 1 wherein said top semiconductor layer has a central region of said one conductivity type surrounded by a region of said opposite conductivity type, said electrode means being further CHARACTERIZED IN THAT one electrode of said electrode means is connected to the central region of said one conductivity type and a second electrode of said electrode means is connected to the surrounding region of said opposite conductivity type.

3. A demultiplexing photodetector as defined in claim 2 wherein the device further includes an outer region of said one conductivity type in each of said semiconductor layers on said substrate, and said electrode means is further CHARACTERIZED IN THAT a third electrode of said electrode means is in contact with said outer region in said top layer, whereby the device is a planar device with all of the electrodes in contact with one surface of said device.

4. A demultiplexing photodetector comprising an indium phosphide substrate, a first indium phosphide layer of one conductivity type epitaxially grown on said substrate, a first quaternary layer having a first bandgap and being epitaxially grown as the opposite conductivity type on said first indium phosphide layer thereby establishing a pn junction in said first quaternary layer, a second indium phosphide layer of the opposite conductivity type epitaxially grown on said quaternary layer, a second quaternary layer with a second bandgap that is different than said first bandgap and being epitaxially grown on said second indium phosphide layer as a layer of opposite conductivity type, said second quaternary layer being doped with a dopant of said first conductivity type in a region of said second quaternary layer thereby establishing a pn junction in said second quaternary layer, and means including electrical contacts for independently coupling potentials to the pn junctions in said first and second quaternary layers.

* * * * *